United States Patent [19]

Grover

[11] Patent Number: 4,799,189

[45] Date of Patent: Jan. 17, 1989

[54] RESYNTHESIZED DIGITAL RADIO FREQUENCY MEMORY

[75] Inventor: R. Kent Grover, Scottsdale, Ariz.

[73] Assignee: Motorola, Inc., Schaumburg, Ill.

[21] Appl. No.: 759,216

[22] Filed: Jul. 26, 1985

[51] Int. Cl.$^4$ .............................................. G11C 27/00
[52] U.S. Cl. ..................................... 364/900; 369/61; 455/18; 375/92; 375/4
[58] Field of Search ............... 364/577, 723, 515, 516, 364/517, 571, 900 MS File, 200 MS File, 484, 487, 723, 602, 200, 900; 342/77, 195, 199, 98, 99, 102, 103; 369/4, 59, 60, 61, 174; 371/23, 30, 31, 32, 40, 42; 375/104, 112, 106, 92, 4, 94, 95; 360/22, 24, 26, 32; 455/18, 20, 63; 340/347 CC

[56] References Cited

U.S. PATENT DOCUMENTS

| | | |
|---|---|---|
| 3,569,934 | 3/1971 | Parr, Jr. .............................. 371/31 |
| 3,947,827 | 3/1976 | Dautremont, Jr. et al. ... 340/173 R C |
| 3,991,409 | 11/1976 | Dautremont, Jr. et al. ... 340/173 R |
| 4,223,404 | 9/1980 | Lowenschuss .......................... 375/3 |
| 4,224,642 | 9/1980 | Mawatavi et al. ................ 360/22 X |
| 4,267,596 | 5/1981 | Lowenschuss ........................ 455/18 |
| 4,280,219 | 7/1981 | Lowenschuss et al. ................ 375/4 |
| 4,315,331 | 2/1982 | Lemoine et al. ...................... 371/31 |
| 4,318,183 | 3/1982 | Byington et al. ................... 364/900 |
| 4,349,918 | 9/1982 | Gordon ................................ 455/20 |
| 4,375,581 | 3/1983 | Jayant ............................. 371/31 X |
| 4,380,816 | 4/1983 | Nicholls ........................... 375/3 X |
| 4,493,090 | 1/1985 | Gordon .......................... 455/18 X |
| 4,539,657 | 9/1985 | Nicholls .............................. 364/45 |
| 4,641,309 | 2/1987 | Nakano et al. ....................... 371/31 |

FOREIGN PATENT DOCUMENTS 2020140  4/1978  United Kingdom ................ 37/31

Primary Examiner—Eddie P. Chan
Assistant Examiner—Paul Kulik
Attorney, Agent, or Firm—Frank J. Bogacz; Raymond J. Warren

[57] ABSTRACT

The present invention describes a resynthesized DRFM and method thereof. A conventional DRFM is utilized with the addition of a computer device. Once the digital pattern signals are stored they are utilized to generate a digital pattern which fills the interpulse period between the pair of signals. The interpulse digital pattern is then adjusted so that the digital pattern phases of the first and second signals match. In general the interpulse period digital pattern is not a uniform replication of the pulsed signal digital pattern because the adjustments have been made in order to accomplish pattern phase between the two pulses. These are then stored in memory until recalled.

4 Claims, 2 Drawing Sheets

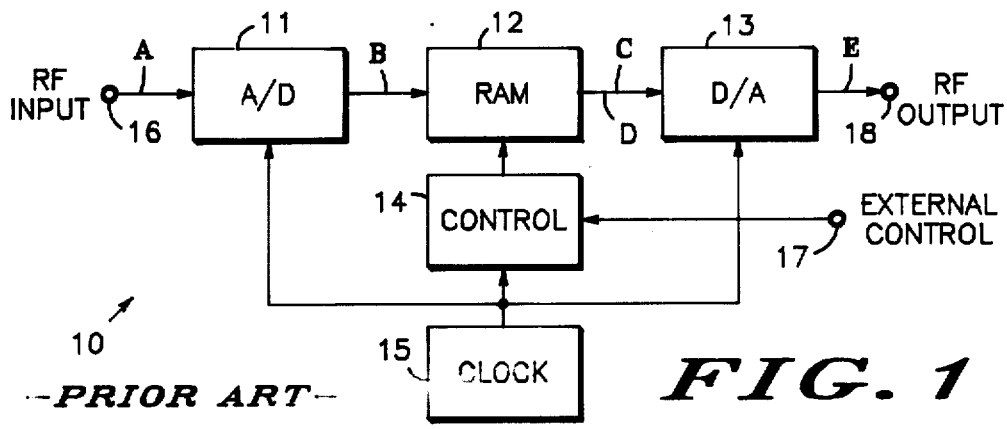
FIG. 1 —PRIOR ART—
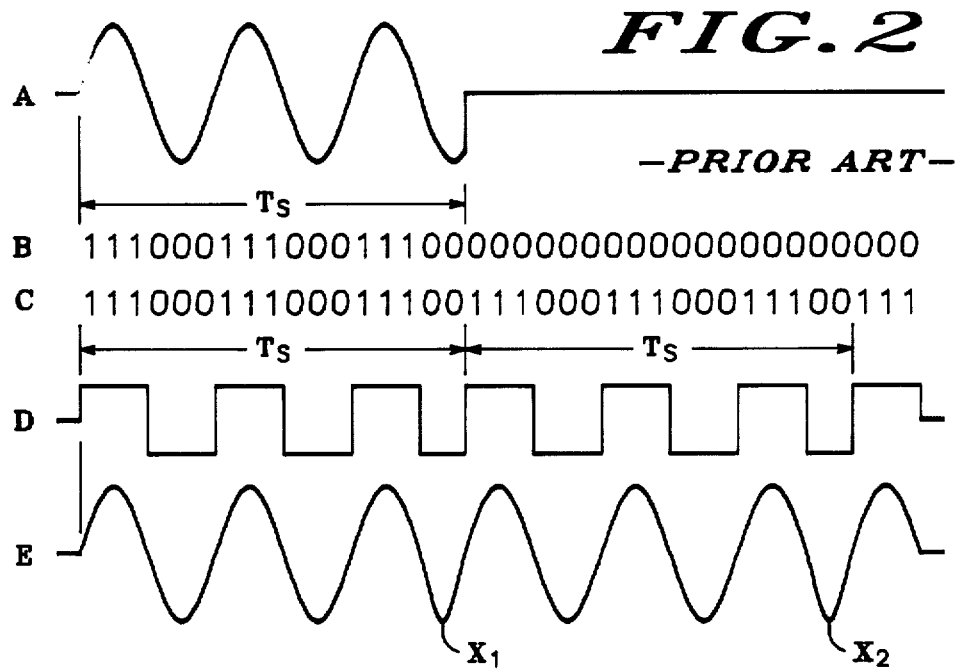
FIG. 2 —PRIOR ART—
FIG. 3 —PRIOR ART—

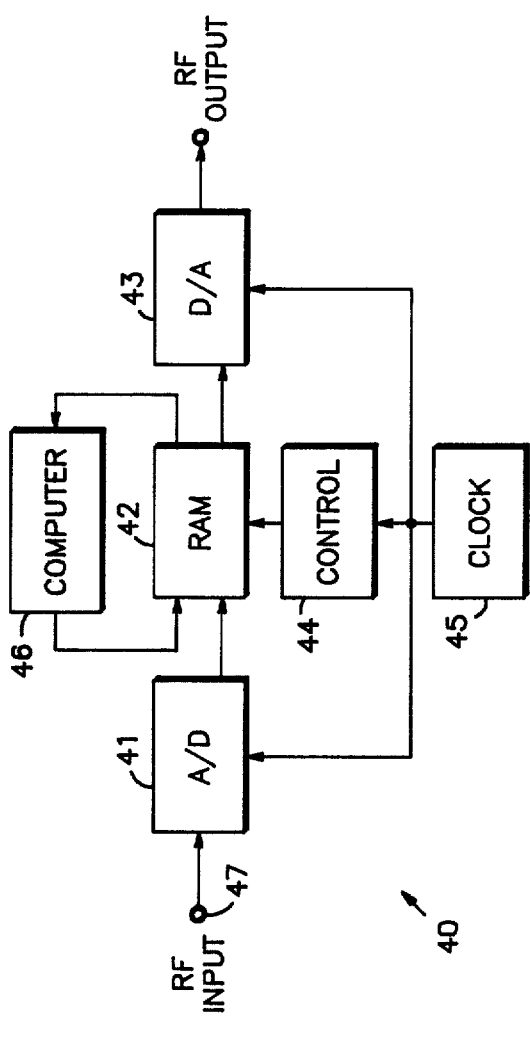
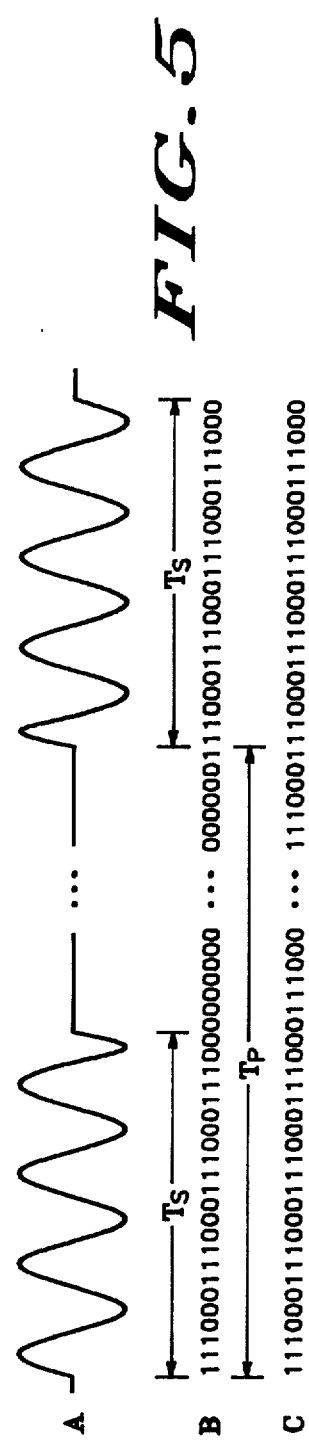

RESYNTHESIZED DIGITAL RADIO FREQUENCY MEMORY

BACKGROUND OF THE INVENTION

This invention relates, in general, to digital radio frequency memories and, more particularly, to resynthesized digital radio frequency memories (resynthesized DRFMs).

DRFMs are currently available in the market, see U.S. Pat. No. 4,349,918 invented by Bruce E. Gordon. DRFMs receive a radio frequency (RF) signal; convert it to a digital pattern set; store the digital pattern set in memory; and later convert that digital pattern set back to an RF signal. Having to convert an analog signal to a digital pattern set and back again can introduce errors in the final signal. These errors will vary depending upon the type of processing used and the particular use of the DRFM output signal. What may start out as a small acceptable error may accumulate into a large unacceptable error in the output signal.

SUMMARY OF THE INVENTION

Accordingly, it is an object of the present invention to provide a resynthesized DRFM and method thereof that will overcome the above deficiencies.

A further object of the present invention is to provide a resynthesized DRFM and method thereof that can generate output signal types with less error.

Another object of the present invention is to provide a resynthesized DRFM and method thereof that is compatible with existing systems.

Still another object of the present invention is to provide a resynthesized DRFM and method thereof that improves input-to-output signal frequency accuracy.

The above and other objects and advantages of the present invention are provided in an apparatus and method of digitally encoding the input signal and using that digital data to recreate a continuous wave source approximately the frequency of the input signal.

A particular embodiment of the present invention consists of a resynthesized DRFM having an input and an output. The resynthesized DRFM has an analog-to-digital converter which has an input, a clock input and an output. The input of the analog-to-digital converter is coupled to the input of the resynthesized DRFM. In addition, resynthesized DRFM contains a memory means for storing a digital signal. The memory means has a first input, a second input, a first output, a second output and a control line. The first input is coupled to the output of the analog-to-digital converter. Further, the resynthesized DRFM contains a digital-to-analog converter having an input, a clock input and an output. The input is coupled to the first output of the memory means and the output is coupled to the output of the resynthesized DRFM. A control means for controlling the starting and stopping addresses of the digital signals in the memory means is also included. The control means has a clock input and an output. The output is coupled to the control line of the memory means. A timing means is provided for timing the resynthesized DRFM. The timing means has an output which is coupled to: the clock input of the analog-to-digital converter; the clock input of said digital-to-analog converter; and the clock input of the control means. A computer means for determining an interpulse pattern between a pair of digital signals is also provided. The computer means has an input and an output. The input is coupled to the second output of the memory means and the output is coupled to the second input of the memory means.

A particular method of the present invention consists of a resynthesized DRFM memory operation comprising the steps of: (a) receiving a first analog signal having a frequency at the input of the analog-to-digital converter; (b) converting the first analog signal into a first digital pattern; (c) storing the first digital having a frequency pattern in the memory means; (d) receiving an interpulse analog duration at said input of said analog-to-digital converter; (e) converting said interpulse analog duration into a interpulse digital duration (f) storing said interpulse digital duration in said memory means; (g) receiving a second analog signal having a frequency at the input of the analog-to-digital converter; (h) converting the second analog signal into a second digital pattern; (i) storing the second digital pattern in the memory means; (j) transferring the first digital pattern to the computer means; (k) generating an interpulse digital pattern following the first digital pattern; (l) transferring the second digital pattern to the computer means; (m) comparing the interpulse digital pattern to the second digital pattern; (n) adjusting the interpulse digital pattern to match phases with the second digital pattern; (o) storing the first digital pattern, second digital pattern and adjusted interpulse digital pattern in the memory means; (p) transmitting the first digital pattern, adjusted interpulse digital pattern, and second digital pattern to the digital-to-analog converter; (q) converting the first digital pattern, adjusted interpulse digital pattern and second digital pattern to analog signals; (r) transmitting the analog signals to the output of the resynthesized DRFM; and (s) recycling said first digital pattern, adjusted interpulse digital pattern and second digital pattern sequentially to create a continuous wave signal source of approximately the frequency of said received analog signal.

BRIEF DESCRIPTION OF THE DRAWINGS

FIG. 1 is a block diagram of a prior art, conventional DRFM;

FIG. 2 is a signal diagram of the input signal operation of the DRFM of FIG. 1;

FIG. 3 is a signal diagram of the output signal operation of a conventional, prior art DRFM;

FIG. 4 is a block diagram of a resynthesized DRFM embodying the present invention; and FIG. 5 is a signal diagram of the resynthesized DRFM interperiod digital pattern generation and output signal operation.

DETAILED DESCRIPTION OF THE DRAWINGS

In FIG. 1 a prior art, conventional DRFM, generally designated 10, is illustrated. DRFM 10 consists essentially of an analog-to-digital (A/D) converter 11, a digital memory, typically consisting of a random access memory (RAM), 12; and a digital-to-analog converter (D/A) 13. In addition, DRFM 10 utilizes an address start/stop controller 14 and a sample rate clock 15.

In operation a radio frequency (RF) signal having a carrier frequency of $f_o$, and a time duration of $T_s$ is received at the input port 16. A typical signal is illustrated in FIG. 2, line A. This pulsed RF signal is transmitted to A/D converter 11. The output of A/D converter 11 is a set of digital signals, on a pattern set, illustrated in FIG. 2, line B. Signal B is coupled to digital memory 12 where it is stored in real time. The start and stop memory storage addresses for signal B are determined by controller 14.

Clock 15 sets the timing for A/D converter 11, RAM 12, and D/A converter 13. Clock 15 causes a sampling rate in converters 11 and 13, memory 12, and controller 14 having a frequency of $f_c$. The frequency of clock 15 combines with the pulse width, $T_s$, to provide an integer number of digital samples. As is illustrated in FIG. 2, line A, pulse width $T_s$ does not necessarily stop at the signals zero crossing. This can cause the last "0" of the digital pattern set to be dropped, see FIG. 2, line B.

When the stored digital pattern set is sequentially recalled from memory at the clock rate; and coupled end-to-end with this same stored digital pattern set, an approximation of a continuous wave (CW) signal source at the approximate frequency of $f_o$ is generated, as represented by FIG. 2, lines C and D. Line C illustrates a binary signal. Line D shows a square wave representation of line C.

The binary signal is then input to D/A converter 13. D/A converter 13, and external lowpass filtering (now shown), then provides an analog RF output signal illustrated in FIG. 2, line E to output port 18. As maybe seen in FIG. 2, line E, the output signal has errors at point $X_1$ and $X_2$.

The frequency difference, $f_e$, between the input signal $f_o$ and the recreated output can be determined by the equation below:

$$f_e = f_o/(T_s f_c) \quad (1)$$

Where:
  $f_e$ = the maximum frequency error between input and output signals;
  $f_o$ = the frequency of the input signal;
  $f_c$ = the frequency of the sampling rate of the DRFM; and
  $T_s$ = the pulse width of the input signal.

By way of example, if a DRFM with a 1 GHz sampling rate ($f_c$) receives a signal having a frequency ($f_o$) of 100 MHz and pulse width ($T_s$) of 1 usec a frequency error ($f_e$) of 100 KHz can be produced in the recreated CW output signal. This calculation does assume that the optimum selection of start and stop addresses for end-to-end recreation were selected, otherwise the frequency error can be much larger.

Another example of the problems inherent in conventional DRFMs can be seen by looking at coherent systems (such as radar). Coherent systems derive their pulsed signals from a continuous sinewave oscillator (CW source). The continuous signal is then gated to provide pulse signals from the system. The pulsed signals will then have a known phased relationship to each other. In general, there is a high probability that the frequency of the CW source ($f_o$) will not be an integer product of the DRFM clock frequency ($f_c$), but will be a fraction.

When $f_c/f_o$ is a fractional number the digital pattern of the incoming signal is not a uniform consistent pattern, but must have a cyclic pattern much longer than the basic sign wave pattern.

An example of a continuous wave signal may be seen in FIG. 3. At points 3A and 3B the digital pattern has an extra 1 and 0 added, respectively. These are provided to accommodate the fractional difference between the DRFM sampling clock ($f_c$) and the input signal frequency ($f_o$).

When the DRFM is given only a pulsed sample, $T_s$, of the CW signal, FIG. 3, it may correctly store the pattern contained within $T_s$. When this pattern is sequentially recycled, the frequency regenerated will not be the same as the input signal. This will cause a shift in phase due to the extra 1's and 0's in the original signal. A conventional DRFM has no method to detect or correct this condition in the sequentially recycled pattern used for the recreated output signal. The resynthesized DRFM solves this problem.

Referring now to FIG. 4, a block diagram of a resynthesized DRFM, generally designated 40, embodying the present invention is illustrated. Resynthesized DRFM 40 consists basically of a standard DRFM having an A/D converter 41, a RAM 42, a D/A 43, an address controller 44, and a clock 45. In addition, resynthesized DRFM 40 contains an interpulse pattern computer 46.

Initially, resynthesized DRFM 40 operates the same as a conventional DRFM. An RF signal (FIG. 5, line A) is received at an input port 47 and transmitted to A/D converter 41. A digital pattern set (FIG. 5, line B) is produced by A/D converter 41 and stored in RAM 42. It should be noted here that the signals stored in memory generally consist of at least two pulsed RF signals and the interpulse duration. Interpulse pattern computer 46 then reads the stored digital pattern sets and generates a digital pattern between the pulses. This interpulse digital pattern has the cyclic pattern stored during the pulsed signals along with longer periodic patterns that allow the phase data of the two pulse patterns to be matched.

Computer 46 looks at the first digital pattern set and the second digital pattern set. The first pattern set is used to fill in the area between the first and second digital pattern sets. As may be seen in FIG. 5, line A, two pulses are illustrated having an interpulse duration in between. This interpulse duration translates into a series of zeros after being run through A/D converter 41. As can be seen in FIG. 5, line B, a zero is not detected at the end of the first pulse and a one is not detected at the beginning of the second pulse.

Computer 46 takes the data from the first pattern set and repeats this, in place of the zeros, for the interpulse time. The interperiod time is represented by $T_p$ less $T_s$. If the interphase digital pattern generated does not match the pattern as stated for the second pulse, then computer 46 adjusts the interpulse pattern so that the phase of the digital patterns of the first and second pulses do match. In this case this would be done by adding an extra zero at the beginning of the interpulse pattern and 1 at the end of the interpulse pattern. This pattern is then stored in RAM 42 until being transmitted out through D/A converter 43.

If only one period, $T_p$, is stored in RAM 42 then the frequency error involved, $f_e$, is defined by substituting the pulse width $T_p+T_s$ for $T_s$ in equation (1), above, or:

$$f_e = f_o/[(T_s+T_p)f_c]. \quad (2)$$

Where $T_p$ represents the time from the start of one pulse to the start of the second pulse. The total time period, if one interpulse pattern is used, is: the first pulse $T_s$; the interpulse pattern $T_p-T_s$; and the second pulse $T_s$. By increasing the denominator of the equation the maximum frequency error is greatly reduced.

The increase in accuracy provided is approximately $T_p/T_s$ and can be typically a factor of 30 to 300 or more. The length of $T_p$ is only limited by the amount of space available for storage in RAM 42. By increasing the storage space available and by increasing the number of interpulse periods stored the accuracy may be greatly increased.

If more than one interpulse pattern is determined, then the frequency of error may be defined by:

$$f_e = f_o/[N(T_s + T_p)f_c], \quad (3)$$

Where N is the number of interpulse patterns stored.

It has been shown that this apparatus and method of operation provide solutions to the types of problems set out above. In addition, the present invention can generate output signal types with less error; is compatible to existing DRFMs; and improves CW output signal frequency accuracy.

Thus, it is apparent to one skilled in the art that there has been provided in accordance with the invention, a device and method that will fully satisfy the objects, aims, and advantages set forth above.

While the invention has been described in conjunction with specific embodiments thereof, it is evident that many alterations, modifications, and variations will be apparent to those skilled in the art in light of the foregoing description. For example, the same interpulse pattern generation scheme can also be applied to multiple bit A/D DRFMs. Accordingly, it is intended to embrace all such alterations, modifications and variations in the appended claims.

I claim:

1. A resynthesized digital radio frequency memory (DRFM) for accurately representing an RF input signal utilizing a short pulse sampling signal of insufficient width to represent the input signal frequency, said digital radio frequency memory comprising:

an analog-to-digital converter having an RF input, a clock input and an output;

memory means for storing a first digital pattern, a second digital pattern and an interpulse digital pattern, said memory means having a first input, a second input, a first output, a second output and a control line, said first input being coupled to said output of said analog-to-digital converter, said memory means operating to store said first, second and interpulse digital patterns contiguously from a starting address to stopping address;

a digital-to-analog converter having an input, a clock input and an RF output, said input being coupled to said first output of said memory means;

control means for controlling the starting and stopping addresses for said digital patterns stored in said memory means, said control means having a clock input and an output, said output being coupled to said control line of said memory means;

timing means for timing the resynthesized DRFM, said timing means having an output coupled to said clock input of said analog-to-digital converter, to said clock input of said digital-to-analog converter, and to said clock input of said control means, said timing means operating to produce a timing frequency signal for said sampling of said RF input at a fractional ratio; and computer means for generating an interpulse digital pattern from said first digital pattern and finding and correcting errors resulting from said sampling at a fractional ratio of said RF input signal utilizing said timing frequency signal, said timing frequency signal and said RF input signal being non-multiples, said generating including comparing said interpulse digital pattern with said second digital pattern and altering said interpulse digital pattern so that said first digital pattern and said second digital patterns match bit-for-bit for correcting a phase relationship of said first and second digital patterns to accurately represent said RF input signal, said computer means having an input and an output, said input being coupled to said second output of said memory means and said output being coupled to said second input of said memory means.

2. The resynthesized DRFM of claim 1 wherein said memory means consists of a random access memory device having a first input, a second input, a first output, a second output, and a control line, said first input being coupled to said output of said analog-to-digital converter, said second input being coupled to said output of said computer means, said first output being coupled to said input of said digital-to-analog converter, said second output being coupled to said input of said computer means, and said control line being coupled to said output of said control means.

3. A method of providing a resynthesized digital radio frequency signal from a RF input signal, a resynthesized digital radio frequency memory (DRFM) for accurately representing said RF input signal by utilizing a short pulse sampling signal of insufficient width to represent the input signal frequency, said DRFM having an input and an output and including an analog-to-digital converter, memory means for storing a digital pattern set, said memory means operating to store said digital pattern sets contiguously from a starting address to a stopping address, a digital-to-analog converter, control means for controlling the starting and stopping addresses for said digital pattern sets in said memory means, timing means for timing the resynthesized DRFM for sampling said RF input signal at a fractional ratio rate which is not a multiple of said RF signal input, and computer means for determining an interpulse pattern set between at least two digital pattern sets, said method comprising the steps of:

receiving a first analog signal of said RF input signal having a frequency at an input of said analog-to-digital converter;

converting said first analog signal into a first digital pattern set by sampling said first analog signal at said fractional ratio rate;

storing said first digital pattern set in said memory means;

receiving an interpulse analog duration at said input of said analog-to-digital converter;

converting said interpulse analog duration into an interpulse digital duration by sampling said interpulse analog duration at said fractional ratio rate;

storing said interpulse digital duration in said memory means contiguously with said first digital pattern set;

receiving a second analog signal of said RF input signal at said input of said analog-to-digital converter;

converting said second analog signal into a second digital pattern set by sampling said second analog signal at said fractional ratio rate;

storing said second digital pattern set in said memory means contiguously with said interpulse digital duration;

transferring said first digital pattern set and interpulse digital duration to said computer means;

generating an interpulse digital pattern set;

transferring said second digital pattern set to said computer means;

comparing said generated interpulse digital pattern set to said second digital pattern set;

adjusting said interpulse digital pattern set so that said first digital pattern set compares bit-for-bit with said second digital pattern set to correct a phase relationship of said first and second digital pattern sets to accurately represent said RF pulse input utilizing a relatively short pulse width sampling signal;

storing said first, said adjusted interpulse, and said second digital pattern sets contiguously in said memory means;

transmitting said first, said adjusted interpulse, and said second digital pattern sets to said digital-to-analog converter;

converting said first, said adjusted interpulse, and said second digital pattern sets to analog signals;

transmitting said analog signals to said output of said resynthesized DRFM; and repeating said previous steps of said method on subsequent RF input signals to create said continuous wave resynthesized digital radio frequency signal of approximately the frequency of said received RF input signals.

4. The method of claim 3 wherein said memory means consists of a random access memory device having a first input, a second input, a first output, a second output, and a control line, said first input being coupled to an output of said analog-to-digital converter, said second input being coupled to an output of said computer means, said first output being coupled to an input of said digital-to-analog converter, said second output being coupled to an input of said computer means, and said control line being coupled to an output of said control means.

* * * * *